US012782440B2

(12) United States Patent
Yu et al.

(10) Patent No.: US 12,782,440 B2
(45) Date of Patent: Nov. 3, 2026

(54) SECURE CHIP CAPABLE OF GENERATING SECURE DATA BY ITSELF

(71) Applicant: REALTEK SEMICONDUCTOR CORPORATION, Hsinchu (TW)

(72) Inventors: Yung-Hui Yu, Hsinchu (TW); Chen-Tung Lin, Hsinchu (TW); Chih-Wea Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 2 days.

(21) Appl. No.: 19/054,183

(22) Filed: Feb. 14, 2025

(65) Prior Publication Data

US 2025/0264531 A1 Aug. 21, 2025

(30) Foreign Application Priority Data

Feb. 19, 2024 (TW) ................................ 113105861

(51) Int. Cl.
*G01R 31/3185* (2006.01)
*G01R 31/317* (2006.01)

(52) U.S. Cl.
CPC ................ *G01R 31/318588* (2013.01); *G01R 31/31719* (2013.01)

(58) Field of Classification Search
None
See application file for complete search history.

(56) References Cited

U.S. PATENT DOCUMENTS 9,081,635 B2 7/2015 Tseng
2019/0347446 A1* 11/2019 Chen ...................... G06F 21/73
2020/0382316 A1* 12/2020 Boscher .................. G09C 1/00
2022/0277088 A1 9/2022 Kim

FOREIGN PATENT DOCUMENTS

CN 114860195 A 8/2022
TW 201413580 A 4/2014
TW 202234272 A 9/2022

OTHER PUBLICATIONS

OA letter of a counterpart TW application (appl. No. 113105861) mailed on Mar. 12, 2025.
OA letter of a counterpart TW application (appl. No. 113105861) mailed on Jul. 22, 2024.

* cited by examiner

*Primary Examiner* — Anh Q Tran
(74) *Attorney, Agent, or Firm* — WPAT, PC

(57) ABSTRACT

A secure chip capable of generating secure data by itself. The secure chip can generate secure data of uniqueness without using a circuit having a physically unclonable function (PUF) that is based on process variations. The secure chip includes a true random number generator (TRNG), a control circuit, and a secure storage circuit. The TRNG is configured to output random number data to the control circuit completely via an internal path in a production verification test phase of the secure chip, wherein all the internal path is located in the secure chip. The control circuit is configured to output secure data to the secure storage circuit according to the random number data to have the secure storage circuit store the secure data.

20 Claims, 5 Drawing Sheets

SECURE CHIP CAPABLE OF GENERATING SECURE DATA BY ITSELF

BACKGROUND OF THE INVENTION

1. Field of the Invention

The present disclosure relates to a secure chip, especially to a secure chip capable of generating secure data by itself.

2. Description of Related Art

Many electronic products have built-in information security functions. Generally, such an electronic product has a chip storing a chip unique ID (UID) as an identification and storing a hardware unique key (HUK) for encrypting local data.

Several methods can be used to implant a UID and an HUK in a chip, including:

(1) during a production verification test phase of the chip, using a testing machine to write the UID and the HUK into an anti-fuse one-time programmable (OTP) memory of the chip. However, this method is only suitable for a dependable production process because UIDs written to different chips could be identical due to a deliberate or wrong operation, not to mention that the management of HUKs should be very strict to prevent leakage. In consideration of the above, the method should be realized with very strict personnel management and extremely high security of a production-line, which usually involves additional establishment and certification and leads to the increased cost.

(2) generating uniqueness with a physically unclonable function (PUF) circuit and applying the uniqueness to the generation of the UID and the HUK.

This method generates uniqueness according to slight variations in equivalent circuits caused by process variations and then uses the uniqueness to generate the UID and the HUK. However, the PUF circuit or the like involves a special design, which is usually a full-custom design and may be realized with analog circuits or special circuits (e.g., specific PUF logic circuits or memory cells), and the design is difficult and hard to be applied to other processes and requires more production tests and follow-up processes. The above-mentioned problems lead to the increased cost of the PUF circuit. In addition, since the chip needs an OTP memory to store necessary information (e.g., messages, programs, other root public keys, and so on), the OTP memory cannot be omitted even though the PUF circuit is introduced, which implies that the total cost of the chip will be higher.

In view of the aforementioned problems of the prior arts, this technical field looks forward to a secure data generation technology that is dependable and easily to be implemented.

SUMMARY OF THE INVENTION

An object of the present disclosure is to describe a secure chip capable of generating secure data by itself so as to prevent the problems of the prior arts.

An embodiment of the secure chip of the present disclosure can generate secure data of uniqueness without using a physically unclonable function (PUF) circuit that is based on process variations. The embodiment includes a random number generator, a control circuit, and a secure storage circuit. The random number generator is configured to output random number data to the control circuit completely via a first path in a production verification test phase of the secure chip, wherein all of the first path is located in the secure chip. The control circuit is configured to output secure data to the secure storage circuit according to the random number data to have the secure storage circuit store the secure data. An exemplary implementation of the control circuit includes: a randomness estimation circuit configured to determine whether randomness of the random number data is higher than a threshold, wherein when the randomness of the random number data is higher than the threshold, the control circuit treats the random number data as the secure data, and when the randomness of the random number data is lower than the threshold, the control circuit lowers the threshold and processes the random number data to increase the randomness of the random number data. Another exemplary implementation of the control circuit includes: a read only memory (ROM) configured to store a secure data generation program; and a secure central processing unit configured to execute the secure data generation program to determine whether the randomness of the random number data is higher than a threshold, wherein when the randomness of the random number data is higher than the threshold, the control circuit treats the random number data as the secure data, and when the randomness of the random number data is lower than the threshold, the secure central processing unit lowers the threshold and processes the random number data to increase the randomness of the random number data.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a secure chip capable of generating secure data of uniqueness without using a physically unclonable function (PUF) circuit that is based on process variations. Examples of the secure data of uniqueness include a chip unique ID (UID) and/or a hardware unique key (HUK).

Figure 1:
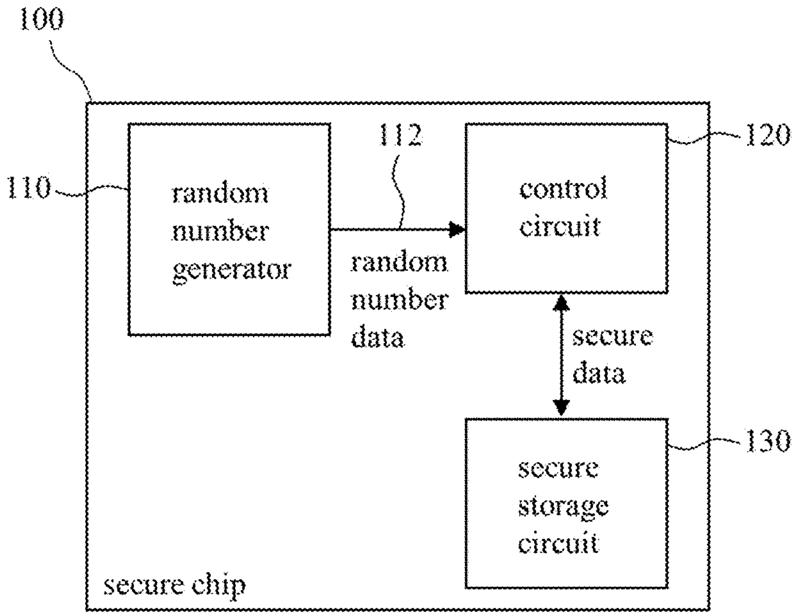
FIG. 1 shows an embodiment of the secure chip of the present disclosure.

FIG. 1 shows an embodiment of the secure chip of the present disclosure. The secure chip 100 of FIG. 1 is a single chip including a random number generator 110, a control circuit 120, and a secure storage circuit 130. The random number generator 110 is configured to output random number data to the control circuit 120 completely via a first path 112 in a production verification test phase of the secure chip 100, wherein all of the first path 112 is located in the secure chip 100 to ensure security. The control circuit 120 is configured to output secure data to the secure storage circuit 130 according to the random number data to have the secure storage circuit 130 store the secure data. It is noted that according to the prior arts, a known design of a secure chip includes a random number generator and a secure storage circuit, but the random number generator does not output random number data to the secure storage circuit via a completely internal path in the secure chip; in other words, the conventional secure chip does not include the first path 112 as shown in FIG. 1, not to mention the lack of the control circuit 120 of FIG. 1.

Figure 2:
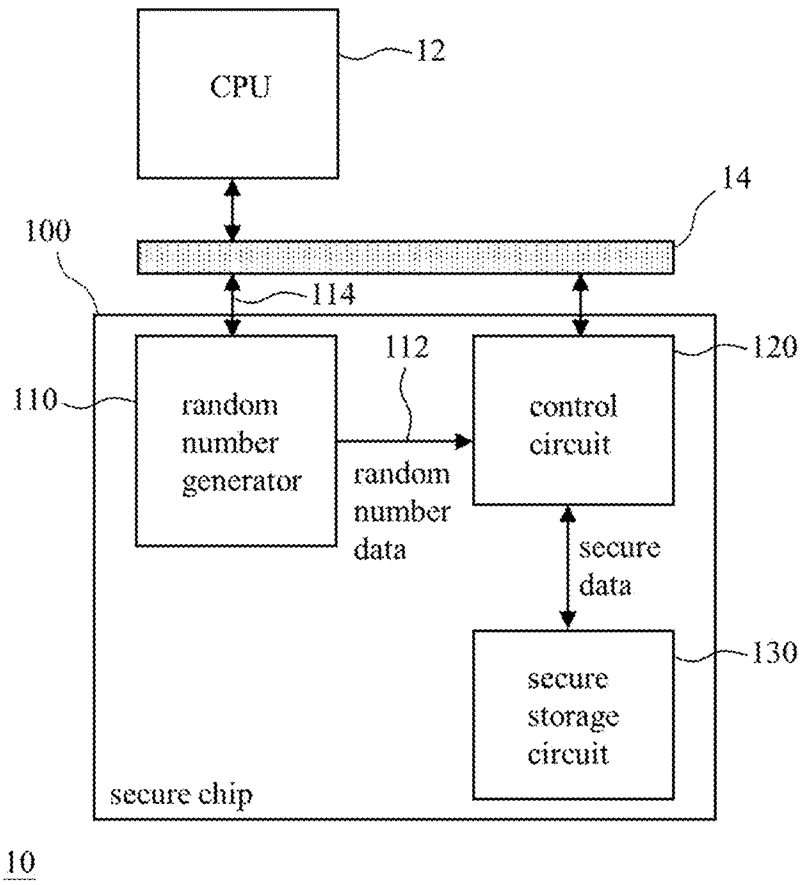
FIG. 2 shows an example of the secure chip of FIG. 1 being applied to a system.

FIG. 2 shows an example of the secure chip 100 of FIG. 1 being applied to a system 10. The system 10 includes the secure chip 100, a central processing unit (CPU) 12, and a system bus 14. In a product usage phase, which means when a user uses the system 10, the CPU 12 is allowed to access random numbers, that are generated by the random number generator 110, via the system bus 14 so as to use the random numbers for the execution of a cryptography algorithm; furthermore, the CPU 12 can access the secure data stored in the secure storage circuit 130 through the system bus 14 and the control circuit 120. It is noted that the secure chip 100 could be a chip independent of the system 10 or a part of the system 10; for example, all circuits in the system 10 including the secure chip 100 are integrated into one chip (i.e., a system on a chip (SoC)), wherein the secure chip 100 functions as a secure subsystem.

Referring FIG. 1, the random number generator 110 is a known/self-developed true random number generator (TRNG). Referring to FIG. 2, in the product usage phase, the random number generator 110 is accessible to the CPU 12 via a second path 114, wherein the first path 112 is different from the second path 114 which is completely or partially outside the secure chip 100.

Figure 3:
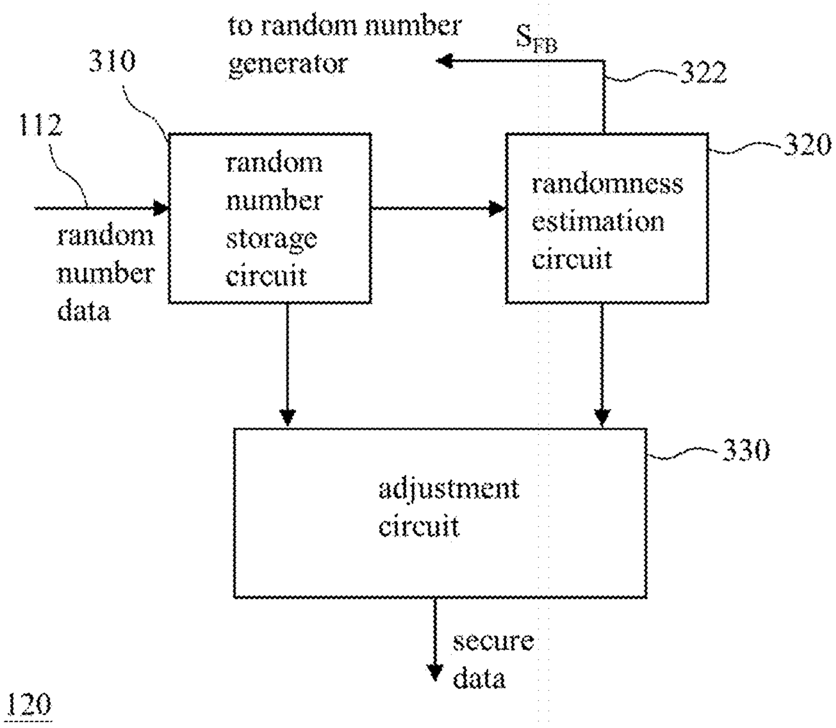
FIG. 3 shows an embodiment of the control circuit of FIG. 1.

FIG. 3 shows an embodiment of the control circuit 120 of FIG. 1. Referring to FIG. 3, the control circuit 120 includes a random number storage circuit 310, a randomness estimation circuit (e.g., known entropy estimation circuit) 320, and an adjustment circuit 330. Provided an implementation of the control circuit 120 is practicable, the implementation may disable/omit one or several of the random number storage circuit 310, the randomness estimation circuit 320, and the adjustment circuit 330.

Referring to FIG. 3, the random number storage circuit 310 is coupled to the first path 112 and configured to store the random number data. In an exemplary implementation, the random number data has 1024 bits.

Referring to FIG. 3, the randomness estimation circuit 320 is configured to determine whether randomness of the random number data is higher than a threshold, wherein the determination of the randomness can be realized with a known/self-developed algorithm and the threshold can be set according to implementation needs. In an exemplary implementation, the randomness estimation circuit 320 is coupled to the random number generator 110 or the random number storage circuit 310 to receive the random number data for the determination. In an exemplary implementation, when the randomness of the random number data is higher than the threshold, the randomness estimation circuit 320 has the control circuit 120 treat the random number data as the secure data. In an exemplary implementation (hereinafter referred to as "process A"), when the randomness of the random number data is lower than the threshold: the randomness estimation circuit 320 outputs a control signal SFB to the random number generator 110 via a feedback path 322 to have the random number generator 110 output new random number data to the control circuit 120; and then the randomness estimation circuit 320 determines whether randomness of the new random number data is higher than the threshold, wherein when the randomness of the new random number data is found higher than the threshold, the randomness estimation circuit 320 has the control circuit 120 treat the new random number data as the secure data, and when the randomness of the new random number data is found lower than the threshold, the randomness estimation circuit 320 outputs the control signal SFB to the random number generator 110 again to repeat the above process. In an exemplary implementation (hereafter referred to as "process B"), when the randomness of the random number data is lower than the threshold, the randomness estimation circuit 320 lowers the threshold and outputs the control signal SFB to the random number generator 110 to obtain new or additional random number data, and then the randomness estimation circuit 320 outputs an adjustment control signal (not shown in the figures) to the adjustment circuit 330 to make the adjustment circuit 330 increase the randomness of some or all of random number data it receives. It is noted that at least one of the processes A and B is applied to determine the randomness of the random number data; for example, the process A is repeated predetermined times (e.g., N times, wherein the N is an integer greater than one) or repeated until the randomness of the random number data reaches the threshold; for example, the process B is applied when the process A has been applied and the randomness of the random number data is still lower than the threshold. In an exemplary implementation, the randomness estimation circuit 320 is configured to output a test report about the randomness of the random number data to external testing equipment (not shown in the figures) for analysis.

Referring to FIG. 3, the adjustment circuit 330 is configured to process the random number data to increase the randomness of the random number data. In an exemplary implementation, the adjustment circuit 330 is coupled to the random number generator 110 or the random number storage circuit 310 to receive the random number data and process them. For example, the adjustment circuit 330 processes the random number data in at least one of the following manners: a known/self-developed debias manner; a known/self-developed re-scrambling manner; and a known/self-developed compression manner. In an exemplary implementation: the adjustment circuit 330 is coupled to the randomness estimation circuit 320 to process the random number data and improve the randomness thereof when the randomness estimation circuit 320 informs the adjustment circuit 330 of the randomness of the random number data being lower than the threshold; and the randomness estimation circuit 320 may make the random number generator 110 provide new or supplemental random number data for the adjustment circuit 330 to allow the adjustment circuit 330 to improve the randomness of the data (e.g., some or all of the random number data the adjustment circuit 330 has) in at least one of the debias manner, the re-scrambling manner, and the compression manner.

Figure 4:
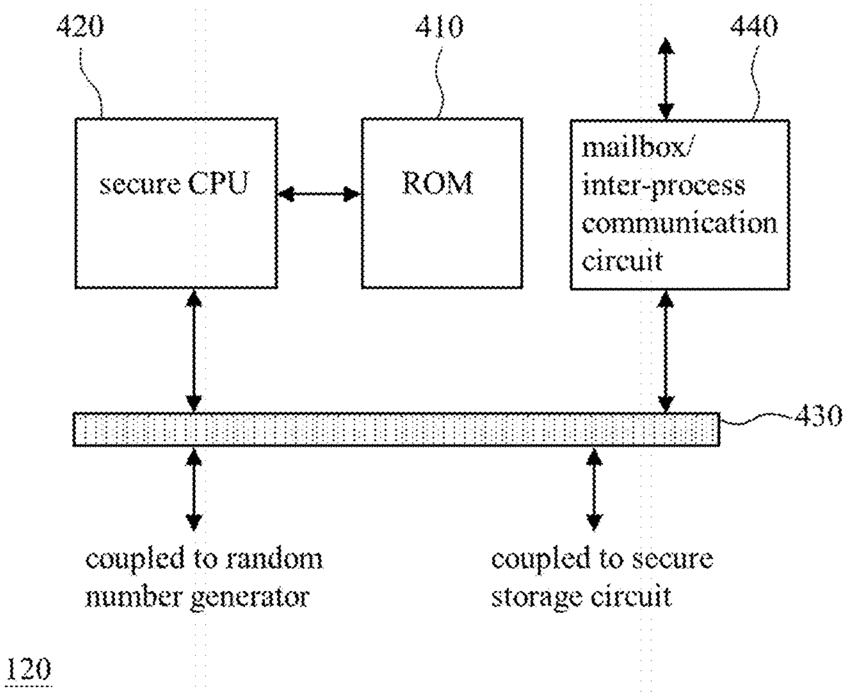
FIG. 4 shows another embodiment of the control circuit of FIG. 1.

FIG. 4 shows another embodiment of the control circuit 120. Referring to FIG. 4, the control circuit 120 includes a read only memory (ROM) 410, a secure CPU 420, and a secure bus 430. It is noted that the secure CPU 420 and the secure bus 430 are set in the secure chip 100 while the CPU 12 and the system bus 14 of FIG. 2 are set outside the secure chip 100. It is also noted that the ROM 410 may be replaced with another kind of storage circuits if the information security is guaranteed.

Referring to FIG. 4, the ROM 410 is configured to store a secure data generation program which is activated in the aforementioned production verification test phase of the secure chip 100. In an exemplary implementation, the ROM

410 includes a known/self-developed memory built-in self-test (MBIST) circuit (not shown in the figures); during the production verification test phase, the MBIST circuit is activated first to verify the correctness of the data stored in the ROM 410, and after the correctness is verified, the secure data generation program is executed by the secure CPU 420. The secure CPU 420 is configured to execute the secure data generation program in the production verification test phase to make the random number generator 110 provide the random number data and to output the secure data to the secure storage circuit 130 according to the random number data via the secure bus 430. After the production verification test phase, the secure CPU 420 may be used to execute a secure service program, which implies that if a secure CPU is an essential part in the design of the secure chip 100 for the execution of the secure service program, the present invention can use this secure CPU to execute the secure data generation program without introducing an extra secure CPU; however, the above-mentioned features are not necessary for the implementation of the present invention.

Referring to FIG. 4, in an exemplary implementation, the secure CPU 420 executes the secure data generation program to determine whether the randomness of the random number data is higher than a threshold and accordingly decide how to treat the random number data. In an exemplary implementation, when the randomness of the random number data is found higher than the threshold, the control circuit 120 treats the random number as the secure data. In an exemplary implementation, when the randomness of the random number data is found lower than the threshold: the secure CPU 420 outputs a control signal SFB to the random number generator 110 via the secure bus 430 or uses at least one signal through known register access methods to have the random number generator 110 output new random number data to the secure CPU 420; and then the secure CPU 420 determines whether randomness of the new random number data is higher than the threshold, wherein when the randomness of the new random number data is found higher than the threshold, the secure CPU 420 has the control circuit 120 treat the new random number data as the secure data, and when the randomness of the new random number data is found lower than the threshold, the secure CPU 420 outputs the control signal SFB to the random number generator 110 or uses the register access methods again to repeat the above process. In an exemplary implementation, when the randomness of the random number data is lower than the threshold, the secure CPU 420 lowers the threshold which may be set higher than or equal to a predetermined minimum value at the beginning. In an exemplary implementation, when the randomness of the random number data is lower than the threshold, the secure CPU 420 processes the random number data to increase the randomness of the random number data. For example, the secure CPU 420 processes the random number data in at least one of the following manners: a known/self-developed debias manner; a known/self-developed re-scrambling manner; and a known/self-developed compression manner.

Referring to FIG. 4, the control circuit 120 further includes a mailbox/inter-process communication (IPC) circuit 440. The mailbox/IPC circuit 440 is set between the secure bus 430 and an external circuit (e.g., the system bus 14 of FIG. 2) and is configured to forward the communications between the secure chip 100 and the external circuit during the aforementioned product usage phase.

Figure 5:
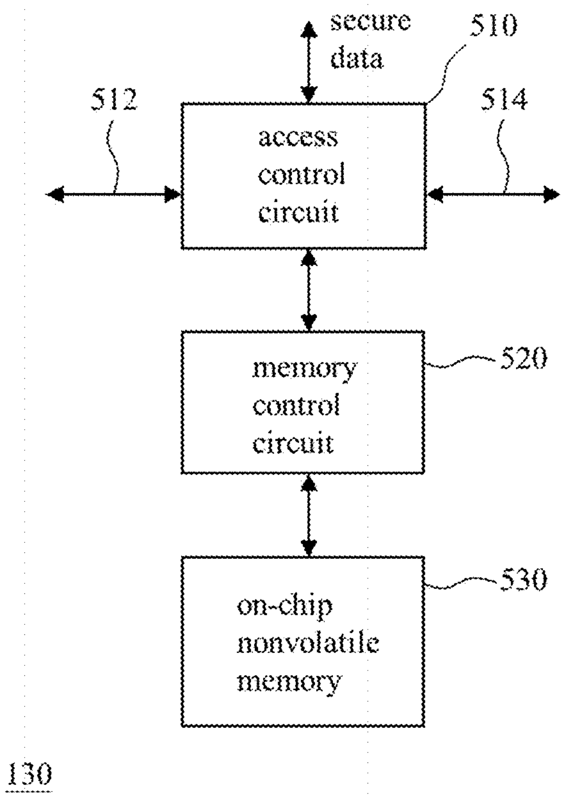
FIG. 5 shows an embodiment of the secure storage circuit of FIG. 1.

FIG. 5 shows an embodiment of the secure storage circuit 130 of FIG. 1. As shown in FIG. 5, the secure storage circuit 130 includes an access control circuit 510, a memory control circuit 520, and an on-chip nonvolatile memory 530.

Referring to FIG. 5, the access control circuit 510 is set between the control circuit 120 and the memory control circuit 520, and the access control circuit 510 is configured to receive the secure data from the control circuit 120 and then store the secure data in the on-chip nonvolatile memory 530 through the memory control circuit 520. The access control circuit 510 is further configured to manage the access to the secure data. For example, when receiving or responding to an external access request from a normal path 512 (e.g., the path coupled to the system bus 14 of FIG. 2), the access control circuit 510 can optionally reject the external access request under predetermined conditions, that is to say refusing to provide the secure data under the predetermined conditions. For example, when the access control circuit 510 is coupled to testing equipment (not shown in the figures) via a testing path 514, the access control circuit 510 can optionally output the secure data to the testing equipment in response to a read request under predetermined conditions. It is noted that the access control circuit 510 could be integrated into the control circuit 120 instead of the secure storage circuit 130, and such integration can be realized by those having ordinary skill in the art based on the present disclosure and common design techniques of the present technical filed.

Referring to FIG. 5, both the memory control circuit 520 and the on-chip nonvolatile memory 530 are known/self-developed circuits. In an exemplary implementation, the on-chip nonvolatile memory 530 includes at least one of the following circuits: a one-time programmable (OTP) memory; an embedded flash; a magnetoresistive random access memory (MRAM); and a phase-change memory (PCM or PRAM).

It is noted that multiple circuits of the present disclosure could be integrated into one circuit, if practicable. It is also noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention is flexible based on the present disclosure.

To sum up, the secure chip of the present disclosure can generate secure data of uniqueness by itself without using any PUF circuit.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A secure chip comprising a random number generator, a control circuit, and a secure storage circuit, wherein:

the random number generator is configured to output random number data to the control circuit completely via a first path in a production verification test phase of the secure chip, wherein all of the first path is located in the secure chip; and the control circuit is configured to output secure data to the secure storage circuit according to the random number data to have the secure storage circuit store the secure data.

2. The secure chip of claim 1, wherein the random number generator is a true random number generator.

3. The secure chip of claim 1, wherein the random number generator is configured to be accessed by a central processing unit via a second path in a product usage phase, wherein the first path is different from the second path, and a part of the second path is outside the secure chip.

4. The secure chip of claim 1, wherein the control circuit includes a random number storage circuit configured to store the random number data including a plurality of random numbers.

5. The secure chip of claim 1, wherein the control circuit includes:

a randomness estimation circuit configured to determine whether randomness of the random number data is higher than a threshold, wherein when the randomness of the random number data is higher than the threshold, the control circuit treats the random number data as the secure data.

6. The secure chip of claim 5, wherein when the randomness of the random number data is lower than the threshold:

the randomness estimation circuit outputs a control signal to the random number generator via a feedback path to make the random number generator output new random number data to the control circuit; and the randomness estimation circuit determines whether randomness of the new random number data is higher than the threshold, wherein when the randomness of the new random number data is higher than the threshold, the control circuit treats the new random number data as the secure data.

7. The secure chip of claim 5, wherein when the randomness of the random number data is lower than the threshold, the control circuit lowers the threshold, and the control circuit includes: an adjustment circuit configured to process the random number data to increase the randomness of the random number data.

8. The secure chip of claim 1, wherein the control circuit includes:

an adjustment circuit configured to process the random number data to increase randomness of the random number data.

9. The secure chip of claim 8, wherein the adjustment circuit is configured to process the random number data in at least one of following manners:

a debias manner; a re-scrambling manner; and a compression manner.

10. The secure chip of claim 1, wherein the control circuit includes:

a read only memory (ROM) configured to store a secure data generation program which is activated during the production verification test phase; and a secure central processing unit configured to execute the secure data generation program during the production verification test phase to make the random number generator provide the random number data and to make the random number generator output the secure data to the secure storage circuit via a secure bus according to the random number data.

11. The secure chip of claim 10, wherein after the production verification test phase, the secure central processing unit is configured to execute a secure service program.

12. The secure chip of claim 10, wherein the secure central processing unit executes the secure data generation program to determine whether randomness of the random number data is higher than a threshold, wherein when the randomness of the random number data is higher than the threshold, the control circuit treats the random number data as the secure data.

13. The secure chip of claim 12, wherein when the randomness of the random number data is lower than the threshold:

the secure central processing unit outputs a control signal to the random number generator via the secure bus or uses register access methods to make the random number generator output new random number data to the secure central processing unit; and the secure central processing unit determines whether randomness of the new random number data is higher than the threshold, wherein when the randomness of the new random number data is higher than the threshold, the control circuit treats the new random number data as the secure data.

14. The secure chip of claim 12, wherein when the randomness of the random number data is lower than the threshold, the secure central processing unit lowers the threshold and then processes the random number data to increase the randomness of the random number data.

15. The secure chip of claim 10, wherein the secure central processing unit is further configured to process the random number data when randomness of the random number data is lower than a threshold and thereby increase the randomness of the random number data.

16. The secure chip of claim 15, wherein the secure central processing unit is configured to process the random number data in at least one of following manners:

a debias manner; a re-scrambling manner; and a compression manner.

17. The secure chip of claim 1, wherein the control circuit or the secure storage circuit includes:

an access control circuit configured to store the secure data in the secure storage circuit and mange access to the secure data.

18. The secure chip of claim 1, wherein the secure storage circuit is an on-chip nonvolatile memory.

19. The secure chip of claim 18, wherein the on-chip nonvolatile memory includes one of following memories:

an anti-fuse one-time programmable (OTP) memory; an embedded flash; a magnetoresistive random access memory (MRAM); and a phase-change memory (PCM or PRAM).

20. The secure chip of claim 1, wherein the secure data includes at least one of following data:

a chip unique ID (UID); and a hardware unique key (HUK).

* * * * *